US007622995B2

(12) United States Patent
Lee et al.

(10) Patent No.: US 7,622,995 B2
(45) Date of Patent: Nov. 24, 2009

(54) NEGATIVE-FEEDBACK TYPE ULTRA-WIDEBAND SIGNAL AMPLIFICATION CIRCUIT

(75) Inventors: Wei-Yang Lee, Taipei (TW); Jean-Fu Kiang, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/142,550

(22) Filed: Jun. 19, 2008

(65) Prior Publication Data
US 2009/0184769 A1 Jul. 23, 2009

(30) Foreign Application Priority Data
Jan. 21, 2008 (TW) .............................. 97102149 A

(51) Int. Cl.
*H03F 1/08* (2006.01)
(52) U.S. Cl. ...................................... 330/293; 330/310
(58) Field of Classification Search ................. 330/293, 330/311, 310, 302, 150, 98
See application file for complete search history.

(56) References Cited

U.S. PATENT DOCUMENTS

| 7,489,202 B1* | 2/2009 | Griffiths et al. ............. 330/311 |
| 7,541,876 B2* | 6/2009 | Lin ............................. 330/311 |
| 7,551,036 B2* | 6/2009 | Berroth et al. .............. 330/311 |
| 7,560,994 B1* | 7/2009 | Lee et al. .................... 330/311 |

* cited by examiner

*Primary Examiner*—Henry K Choe

(57) ABSTRACT

A negative-feedback type ultra-wideband signal amplification circuit is proposed, which is designed for integration to an ultra-wideband (UWB) signal processing circuit system for providing a low-noise amplification function to UWB signals. The proposed circuit architecture is characterized by the provision of a dual-step filter circuit on the input side, the provision of a resistive-type feedback circuit in the transistor-based amplification circuitry, and the provision of a common-source transistor-based amplification circuit on the output side. These features allow the proposed signal amplification circuit to have flat power gain, lower power consumption, low noise figure, and higher operational stability.

25 Claims, 5 Drawing Sheets

NEGATIVE-FEEDBACK TYPE ULTRA-WIDEBAND SIGNAL AMPLIFICATION CIRCUIT

BACKGROUND OF THE INVENTION

1. Field of the Invention

This invention relates to electronic circuit technology, and more particularly, to a negative-feedback type ultra-wideband signal amplification circuit which is designed for integration to an ultra-wideband (UWB) signal processing circuit system for providing a low-noise amplification function to UWB signals.

2. Description of Related Art

With the advent of wireless digital communication technologies, such as wireless networking, mobile phones, GPS (Global Positioning System), and digital TV, the design and manufacture of high-speed digital circuit boards that operate with signals within the gigahertz (GHz) range is in high demand in the electronics industry. Nowadays, the operating frequency of high-speed digital circuitry has advanced to the ultra-wide band (UWB) range from 3.1 GHz to 10.6 GHz. In the design of high-speed digital circuitry, the low-nose amplifier (LNA) is an important component that can amplify UWB signals with low-noise characteristics.

In practical applications, since the UWB has a bandwidth of $10.6-3.1=7.5$ GHz, it is a challenge in the design of an LNA circuit for UWB signal amplification with a flat gain across this very broad bandwidth. Besides, for high performance applications, the design of UWB LNA circuitry typically requires the following operating characteristics: low power consumption, low noise figure, and high operational stability.

Presently in the electronics industry, various types of UWB LNA circuit architectures have been proposed and developed. However, for even higher performance applications, there still exists a need for improvements in power gain, power consumption, noise figure, and operational stability of conventional UWB LNA circuit architectures.

SUMMARY OF THE INVENTION

It is therefore an objective of this invention to provide a negative-feedback type ultra-wideband signal amplification circuit for UWB LAN application which can offer flat power gain, lower power consumption, lower noise figure, and higher operational stability.

The negative-feedback type ultra-wideband signal amplification circuit according to the invention is designed for integration to an ultra-wideband (UWB) signal processing circuit system for providing a low-noise amplification function to UWB signals.

In architecture, the negative-feedback type ultra-wideband signal amplification circuit of the invention comprises: (A) a first-stage amplification module; and (B) a second-stage amplification module; wherein the first-stage amplification module includes: (A1) a dual-step filtering circuit unit; (A2) an input-side transistor circuit unit; (A3) a first-stage feedback circuit unit; and (A4) a first-stage load circuit unit; and wherein the second-stage amplification module includes: (B1) an output-side transistor circuit unit; (B2) a second-stage feedback circuit unit; and (B3) a second-stage load circuit unit.

The negative-feedback type ultra-wideband signal amplification circuit according to the invention is characterized by the provision of a dual-step filter circuit on the input side, the provision of a resistive-type feedback circuit in the transistor-based amplification circuitry, and the provision of a common-source transistor-based amplification circuit on the output side. These features allow the proposed signal amplification circuit to have flat power gain, lower power consumption, low noise figure, and higher operational stability.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The negative-feedback type ultra-wideband signal amplification circuit according to the invention is disclosed in full details by way of preferred embodiments in the following with reference to the accompanying drawings.

Application and Function of the Invention

Figure 1:
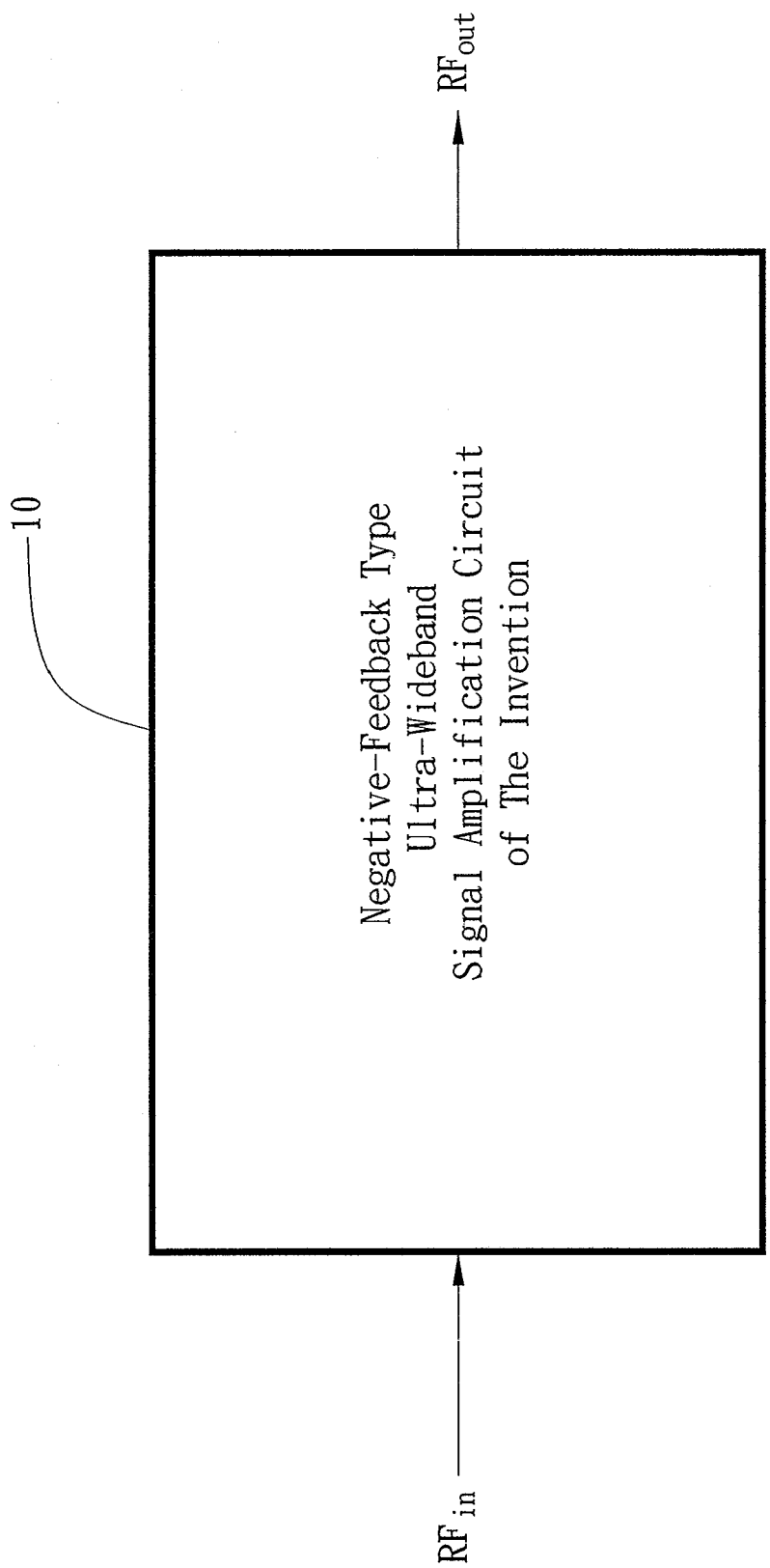
FIG. 1 is a schematic diagram showing the I/O functional model of the signal amplification circuit of the invention.

FIG. 1 is a schematic diagram showing the input/output (I/O) functional model of the negative-feedback type ultra-wideband signal amplification circuit according to the invention (which is here encapsulated in a box indicated by the reference numeral 10, and is hereinafter referred in short as "signal amplification circuit"). As shown, the signal amplification circuit of the invention 10 is designed with an I/O interface having a signal input port $RF_{in}$ and a signal output port $RF_{out}$; wherein the signal input port $RF_{in}$ is used to receive a high-frequency gigahertz signal, such as an ultra-wideband (UWB) signal, while the signal output port $RF_{out}$ is used to output an amplified version of the input signal.

In practical applications, for example, the signal amplification circuit of the invention 10 can be integrated to a UWB signal processing system for use as a low-noise amplifier (LNA) for amplifying UWB signals.

Architecture of the Invention

Figure 2:
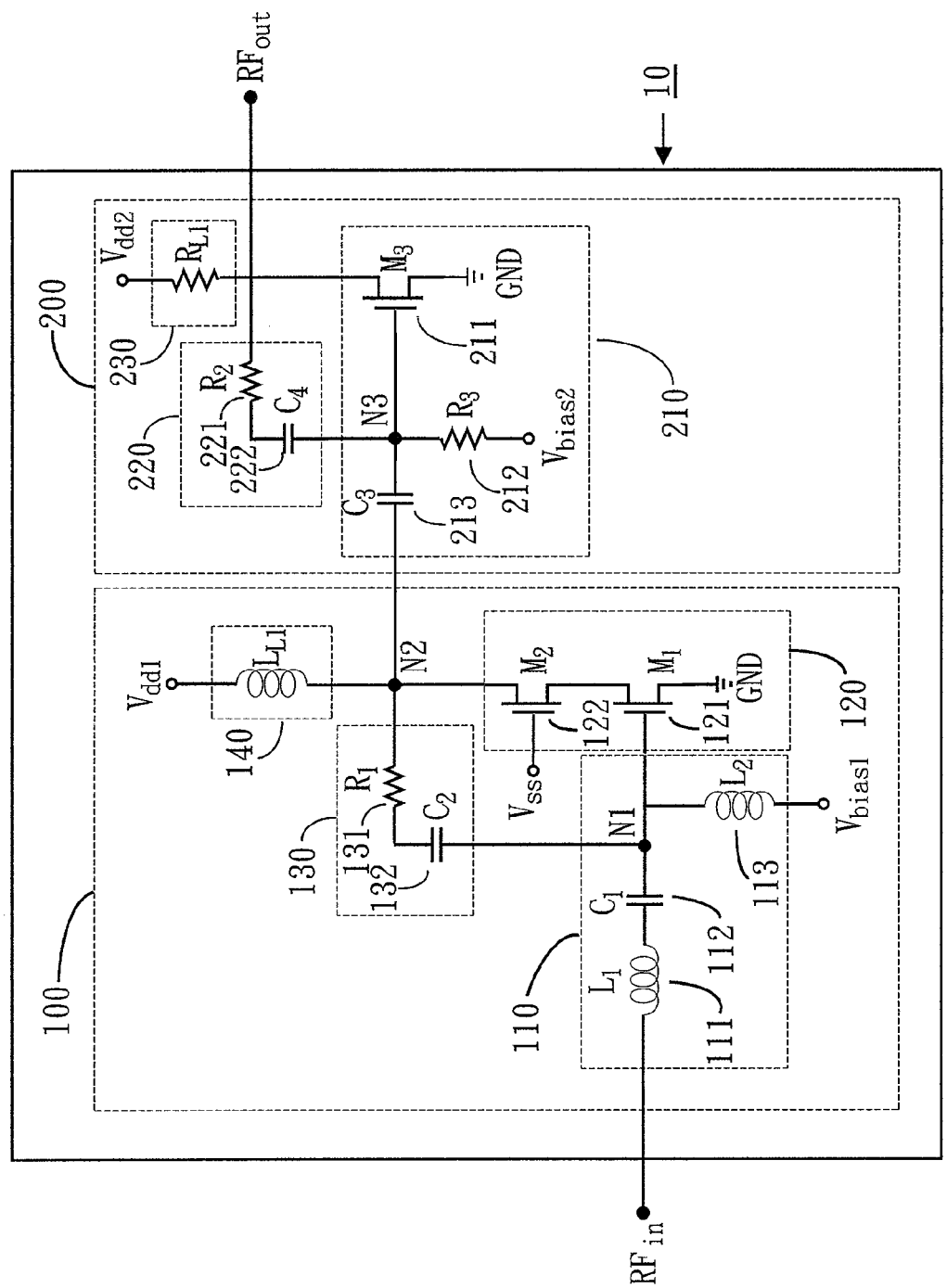
FIG. 2 is a schematic diagram showing the circuit architecture of the signal amplification circuit of the invention.

As shown in FIG. 2, in architecture, the signal amplification circuit of the invention 10 comprises two stages of amplification circuit modules: (A) a first-stage amplification module 100; and (B) a second-stage amplification module 200; wherein the first-stage amplification module 100 includes: (A1) a dual-step filtering circuit unit 110; (A2) an input-side transistor circuit unit 120; (A3) a first-stage feedback circuit unit 130; and (A4) a first-stage load circuit unit 140; and wherein the second-stage amplification module 200 includes: (B1) an output-side transistor circuit unit 210: (B2) a second-stage feedback circuit unit 220; and (B3) a second-stage load circuit unit 230. Firstly, the respective attributes and functions of these constituent components of the invention are described in details in the following.

Dual-Step Filtering Circuit Unit 110

The dual-step filtering circuit unit 110 is composed of a first inductive element ($L_1$) 111, a capacitive element ($C_1$) 112, and a second inductive element ($L_2$) 113. In circuit arrangement, the first inductive element ($L_1$) 111 is connected between the signal input port $RF_{in}$ and the capacitive element ($C_1$) 112; the capacitive element ($C_1$) 112 is connected between the first inductive element ($L_1$) 111 and a first node (N1); and the second inductive element ($L_2$) 113 is connected between the first node (N1) and a first bias voltage $V_{bias1}$.

In operation, this dual-step filtering circuit unit 110 is used to provide an LC-based dual-step filtering function for the signal input $RF_{in}$, wherein the first filtering step is performed by the LC circuit ($L_1$, $C_1$), and he second filtering step is performed by the LC circuit ($L_2$, $C_{gs1}$) where $C_{gs1}$ is the gate-to-source capacitance of the first transistor ($M_1$) 121 in the input-side transistor circuit unit 120.

Figure 3:
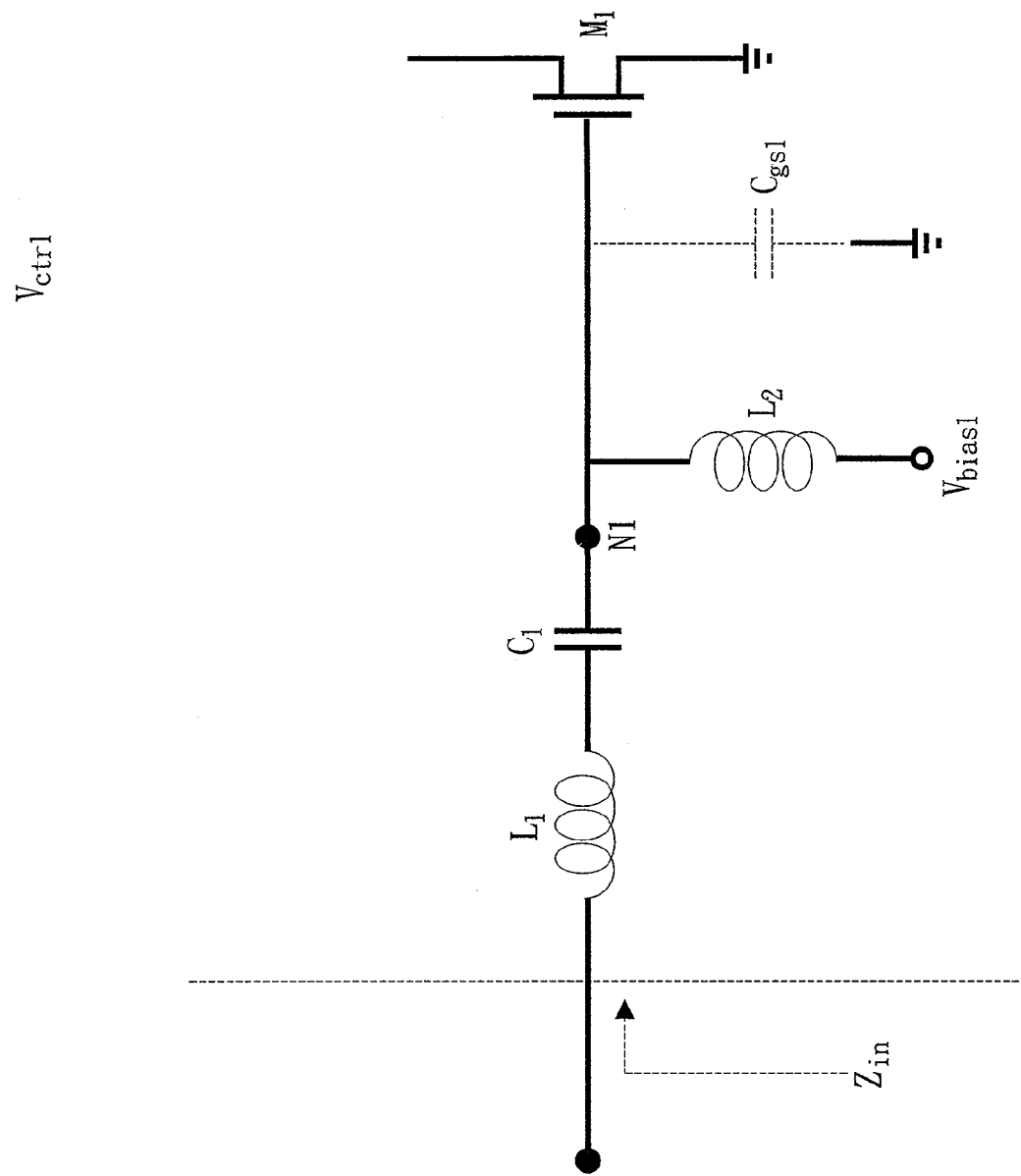
FIG. 3 shows an equivalent circuit of a dual-step filtering circuit unit utilized by the signal amplification circuit of the invention.

The equivalent circuit of the LC architecture ($L_1$, $C_1$, $L_2$, $C_{gs1}$) of the dual-step filtering circuit unit 110 is shown in FIG. 3. This LC architecture is capable of providing a broadband impedance match to the input impedance $Z_{in}$, thereby allowing the signal amplification circuit of the invention 10 to be capable of broadband signal amplification.

Input-Side Transistor Circuit Unit 120

The input-side transistor circuit unit 120 is composed of a pair of transistors including a first transistor ($M_1$) 121 and a second transistor ($M_2$) 122. In practical application, the first transistor ($M_1$) 121 and the second transistor ($M_2$) 122 can be implemented with PMOS (P-type metal oxide semiconductor), NMOS (N-type MOS), or BJT (bipolar junction transistor) transistors (FIG. 2 shows an example of NMOS implementation). In circuit arrangement, the first transistor ($M_1$) 121 has its gate (control terminal) connected to the first node (N1), it source (first connecting terminal) connected to a grounding point GND, and its drain (second connecting terminal) connected to the source of the second transistor ($M_2$) 122; while the second transistor ($M_2$) 122 has its gate connected to a fixed voltage source $V_{ss}$, its source connected to the drain of the first transistor ($M_1$) 121, and its drain connected to a second node (N2).

In operation, the input-side transistor circuit unit 120 is used to provide a first-stage amplification function for the signal input $RF_{in}$. The amplified signal is then transferred via the second node (N2) to the second-stage amplification module 200. Since the first transistor ($M_1$) 121 and the second transistor ($M_2$) 122 are serially connected, it allows the first-stage amplification function to provide a broadband output.

First-Stage Feedback Circuit Unit 130

The first-stage feedback circuit unit 130 is connected between the second node (N2) and the first node (N1) for providing a feedback path from the output of the first-stage amplification module 100 to the gate of the first transistor ($M_1$) 121. In practical application, the first-stage feedback circuit unit 130 can be implemented with either an RC (resistance-capacitance) circuit or an RL (resistance-inductance) circuit. FIG. 2 shows an example of implementation with an RC circuit composed of a resistor ($R_1$) 131 and a capacitor ($C_2$) 132. In circuit arrangement, the resistor ($R_1$) 131 has one end connected to the second node (N2), i.e., the output of the first-stage amplification module 100, and the other end connected in series to the capacitor ($C_2$) 132; and the capacitor ($C_2$) 132 has one end connected in series to the resistor ($R_1$) 131 and the other end connected to the first node (N1), i.e., the gate of the first transistor ($M_1$) 121.

In operation, the first-stage feedback circuit unit 130 is used to feed back the output signal of the first-stage amplification module 100 to the gate of the first transistor ($M_1$) 121. In this feedback circuit architecture, the capacitor ($C_2$) 132 is used to provide a dc-blocking effect for blocking the direct current component (if any) in the feedback signal. The provision of this first-stage feedback circuit unit 130 allows the first-stage amplification module 100 to have flat and broadband gain characteristics.

First-Stage Load Circuit Unit 140

The first-stage load circuit unit 140 is implemented with an inductive element ($L_{L1}$) which is connected between a first drive voltage $V_{dd1}$ and the second node (N2), i.e., the output of the first-stage amplification module 100. In operation, since this first-stage load circuit unit 140 is based on inductance rather than resistance (which is used by conventional circuitry), it consumes less power and thereby can provide an increased gain for signal amplification.

Output-Side Transistor Circuit Unit 210

The output-side transistor circuit unit 210 is composed of a third transistor ($M_3$) 211, a bias resistor ($R_3$) 212, and a capacitive element ($C_3$) 213. In practical application, the third transistor ($M_3$) 211 can be implemented with a PMOS, NMOS, or BJT transistor. FIG. 2 shows an example of NMOS implementation.

In circuit arrangement, the NMOS-based third transistor ($M_3$) 211 has its gate (control terminal) connected to a third node (N3), its source (first connecting terminal) connected to the grounding point GND, and its drain (second connecting terminal) connected to the signal output port $RF_{out}$. The bias resistor ($R_3$) 212 is connected between the third node (N3) and a second bias voltage $V_{bias2}$. The capacitive element ($C_3$) 213 has one end connected between the second node (N2), i.e., the output of the first-stage amplification module 100, and the other end connected to the third node (N3), i.e., the gate of the third transistor ($M_3$) 211.

The above circuit arrangement constitutes a common-source architecture for the third transistor ($M_3$) 211, which can provide a broadband impedance match at the signal output port $RF_{out}$. In actual applications, the bias resistor ($R_3$) 212 is preferably implemented with a large resistance at the maximum possible value to prevent leakage of the UWB signal being amplified. The capacitive element ($C_3$) 213 is used to provide a dc-blocking effect for blocking the direct current component (if any) in the output signal from the first-stage amplification module 100.

Second-Stage Feedback Circuit Unit 220

The second-stage feedback circuit unit 220 is connected between the signal output port $RF_{out}$ and the third node (N3) for providing a feedback path from the signal output port $RF_{out}$ to the gate of the third transistor ($M_3$) 211. In practical application, the second-stage feedback circuit unit 220 can be implemented with either an RC circuit or an RL circuit. FIG. 2 shows an example of implementation with an RC circuit composed of a resistor ($R_2$) 221 and a capacitor ($C_4$) 222. In circuit arrangement, the resistor ($R_2$) 221 has one end connected to the signal output port $RF_{out}$ and the other end connected in series to the capacitor ($C_4$) 222. Further, the capacitor ($C_4$) 222 has one end connected in series to the resistor ($R_2$) 221 and the other end connected to the third node (N3), i.e., the gate of the third transistor ($M_3$) 211.

In operation, the second-stage feedback circuit unit 220 is used to feed back the output signal $RF_{out}$ of the second-stage amplification module 200 via the third node (N3) to the gate of the third transistor ($M_3$) 211. In this feedback circuit architecture, the capacitor ($C_4$) 222 can provide a dc-blocking effect for blocking the direct current component (if any) in the feedback signal. The provision of this second-stage feedback circuit unit 220 allows the second-stage amplification module 200 to have flat and broadband gain characteristics.

Second-Stage Load Circuit Unit 230

The second-stage load circuit unit 230 is implemented with a resistor ($R_{L1}$) which is connected between the signal output port $RF_{out}$ and a second drive voltage $V_{dd2}$. In operation, this resistor-based second-stage load circuit unit 230 is used to provide an enhanced amplification effect to the output signal $RF_{out}$.

Operation of the Invention

In actual operation, the signal amplification circuit of the invention 10 receives an input signal in UWB range at the signal input port $RF_{in}$, then amplifies the input signal using the first-stage amplification module 100 and the second-stage amplification module 200, and then outputs the amplified signal from the signal output port $RF_{out}$.

Operating Characteristics of the Invention

The following is a description of some operating characteristics of the signal amplification circuit of the invention 10 through circuit simulation and experimentation.

(1) $S_{21}$-$R_1$ Characteristic Plot

Figure 4:
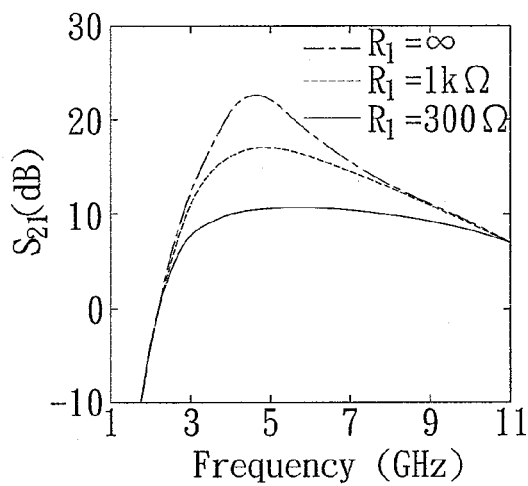
FIG. 4 is a graph showing $S_{21}$-$R_1$ characteristics of the signal amplification circuit of the invention with respect to different resistance values of the resistor in the first-stage feedback circuit unit.

FIG. 4 is a graph showing $S_{21}$-$R_1$ (gain versus $R_1$) characteristic for the signal amplification circuit of the invention 10 with respect to three different resistance values (300Ω, 1 kΩ, ∞) of the resistor ($R_1$) 131 in the first-stage feedback circuit unit 130. As shown, within the UWB range from 3.1 GHz to 10.6 GHz, the value of $S_{21}$ increases with the value of $R_1$.

(2) $S_{22}$-$R_2$ Characteristic Plot

Figure 5:
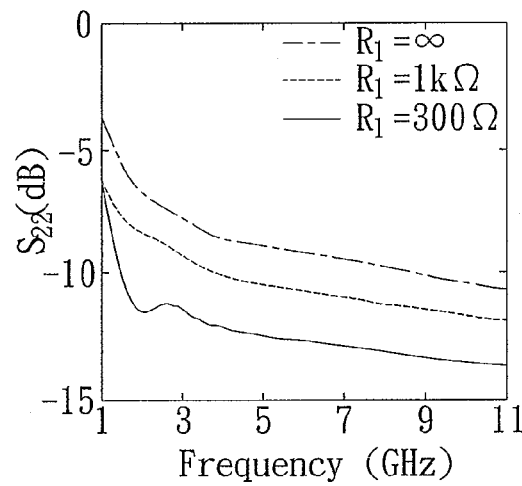
FIG. 5 is a graph showing $S_{22}$-$R_2$ characteristics of the signal amplification circuit of the invention with respect to different resistance values of the resistor in the second-stage feedback circuit unit.

FIG. 5 is a graph showing $S_{22}$-$R_2$ (return loss versus $R_2$) characteristic for the signal amplification circuit of the invention 10 with respect to three different resistance values (300Ω, 1 kΩ, ∞) of the resistor ($R_2$) 221 in the second-stage feedback circuit unit 220. As shown, within the UWB range from 3.1 GHz to 10.6 GHz, the value of $S_{22}$ decreases with increasing value of $R_2$.

(3) 3 dB $S_{21}$ Characteristic Plot

Figure 6:
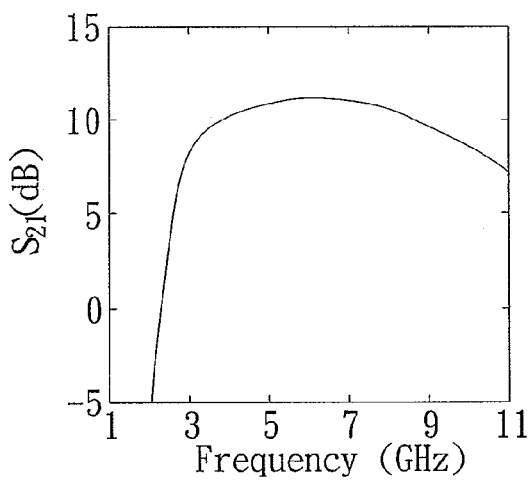
FIG. 6 is a graph showing $S_{21}$ versus input frequency characteristics of the signal amplification circuit of the invention.

FIG. 6 is a graph showing S21 versus input frequency characteristic for the signal amplification circuit of the invention 10. As shown, within the UWB range from 3.1 GHz to 10.6 GHz, the signal amplification circuit of the invention 10 can offer a gain of approximately 10 dB with a maximum value of about 11.3 dB.

(4) Input Reflection Loss and Output Reflection Loss $S_{11}$/$S_{22}$

Figure 7:
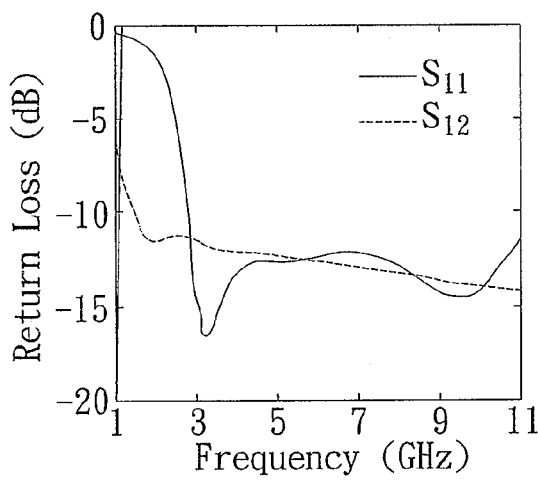
FIG. 7 is a graph showing input and output return losses $S_{11}/S_{22}$ versus input frequency of the signal amplification circuit of the invention.

FIG. 7 is a graph showing the characteristics of input and output return losses $S_{11}$/$S_{22}$ versus input frequency for the signal amplification circuit of the invention 10. As shown, owing to the provision of the dual-step filtering circuit unit 110, the input return loss $S_{11}$ can be reduced to below −11 dB within the UWB range from 3.1 GHz to 10.6 GHz; and owing to the provision of the common-source third transistor ($M_3$) 211, the output return loss S22 can be reduced to below −12 dB within the UWB bandwidth.

(5) Noise Figure (NF)

Figure 8:
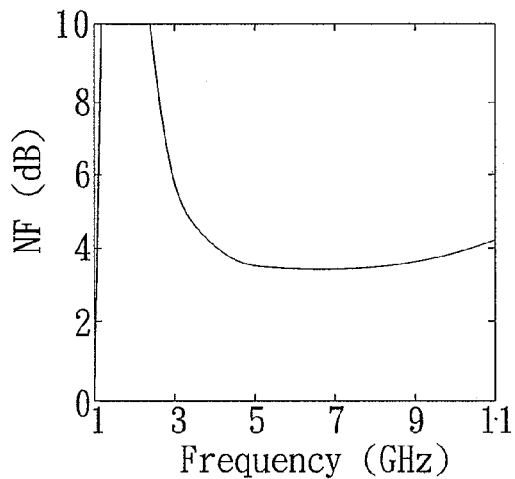
FIG. 8 is a graph showing noise figure (NF) versus input frequency of the signal amplification circuit of the invention.

FIG. 8 is a graph showing characteristics of noise figure (NF) versus input frequency for the signal amplification circuit of the invention 10. As shown, within the UWB range from 3.1 GHz to 10.6 GHz, the signal amplification circuit of the invention 10 can generate an amplified signal with a noise figure below 4 dB with a minimum NF of about 3.5 dB.

(6) Third-Order Intermodulation Intercept Point ($IIP_3$) and 1 dB Compression Point $P_{1\ dB}$)

Figure 9:
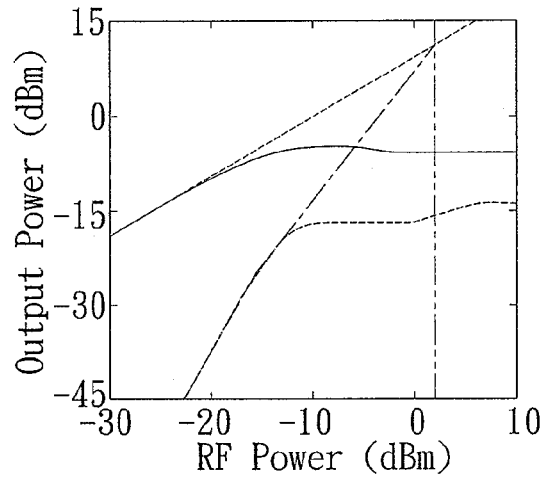
FIG. 9 is a graph showing output power versus third order intermodulation intercept point (IIP$_3$) and 1 dB compression point $P_{1\,dB}$ characteristics of the signal amplification circuit of the invention.

FIG. 9 is a graph showing characteristics of output power versus third order intermodulation intercept point ($IIP_3$) and 1 dB compression point $P_{1\ dB}$ for the signal amplification circuit of the invention 10. As shown, the signal amplification circuit of the invention 10 can generate an amplified signal with $IIP_3$=2 dBm and $P_{1\ dB}$=−14 dBm.

(7) Stability Factor

Figure 10:
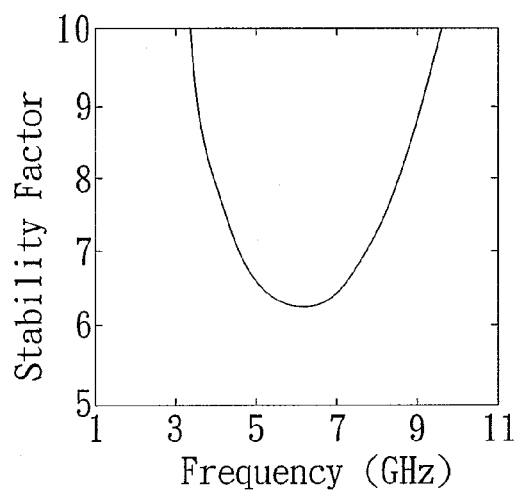
FIG. 10 is a graph showing stability factor versus input frequency of the signal amplification circuit of the invention.

FIG. 10 is a graph showing characteristics of stability factor versus input frequency for the signal amplification circuit of the invention 10. As shown, within the UWB range from 3.1 GHz to 10.6 GHz, the signal amplification circuit of the invention 10 can output an amplified signal with a good stability factor. As to power consumption, the first-stage amplification module 100 draws an electrical current of 9.66 mA from a 1.5 V drain voltage, while the second-stage amplification module 200 draws an electrical current of 4.3 mA from a 1.0 V drain voltage. As a result, the total power consumption is approximately 18.97 mW.

In conclusion, the invention provides a negative-feedback type ultra-wideband signal amplification circuit which is characterized by the provision of a dual-step filter circuit on the input side, the provision of a resistive-type feedback circuit in the transistor-based amplification circuitry, and the provision of a common-source transistor-based amplification circuit on the output side. These features allow the proposed signal amplification circuit to have flat power gain, lower power consumption, low noise figure, and higher operational stability. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A negative-feedback type ultra-wideband signal amplification circuit having an input/output interface including a signal input port and a signal output port, for amplifying an input signal at the signal input port;

the negative-feedback type ultra-wideband signal amplification circuit comprising a first-stage amplification module and a second-stage amplification module. wherein:

the first-stage amplification module includes:

a dual-step filtering circuit unit, which is connected between the signal input port and a first node for providing a dual-step filtering function for the input signal;

an input-side transistor circuit unit, which includes a first transistor and a second transistor, each having a control terminal, a first connecting terminal, and a second connecting terminal; wherein the first transistor has its control terminal connected to the first node, its first connecting terminal connected to a grounding point, and its second connecting terminal connected to the first connecting terminal of the second transistor; and wherein the second transistor has its control terminal connected to a fixed voltage source, its first connecting terminal connected to the second connecting terminal of the first transistor, and its second connecting terminal connected to the a second node;

a first-stage feedback circuit unit, which is connected between the second node and the first node, for providing a feedback path from the second node via the first node to the control terminal of the first transistor; and a first-stage load circuit unit, which is connected between the second node and a first drive voltage, for providing an enhanced amplification effect to a first-stage output signal at the second node; and wherein:

the second-stage amplification module includes:

an output-side transistor circuit unit, which includes a third transistor having a control terminal electrically coupled to the second node in the first-stage amplification module, a first connecting terminal connected to the signal output port, and a second connecting terminal connected to the grounding point;

a second-stage feedback circuit unit, which is connected between the signal output port and the control terminal of the third transistor, for providing a feedback path from the signal output port to the control terminal of the third transistor; and a second-stage load circuit unit, which is connected between the signal output port and a second drive voltage, for providing an enhanced amplification effect to a second-stage output signal at the signal output port.

2. The negative-feedback type ultra-wideband signal amplification circuit of claim 1, wherein the dual-step filtering circuit unit includes:

a serially-connected LC circuit, which is connected between the signal input port and the first node; and an inductive element, which is connected between the first node and a first bias voltage.

3. The negative-feedback type ultra-wideband signal amplification circuit of claim 1, wherein the input-side transistor circuit unit is implemented with a PMOS-based circuit architecture.

4. The negative-feedback type ultra-wideband signal amplification circuit of claim 1, wherein the input-side transistor circuit unit is implemented with an NMOS-based circuit architecture.

5. The negative-feedback type ultra-wideband signal amplification circuit of claim 1, wherein the input-side transistor circuit unit is implemented with a BJT (bipolar junction transistor) based circuit architecture.

6. The negative-feedback type ultra-wideband signal amplification circuit of claim 1, wherein the first-stage feedback circuit unit is implemented with an RC (resistance-capacitance) circuit.

7. The negative-feedback type ultra-wideband signal amplification circuit of claim 1, wherein the first-stage feedback circuit unit is implemented with an RL (resistance-inductance) circuit.

8. The negative-feedback type ultra-wideband signal amplification circuit of claim 1, wherein the first-stage load circuit unit is implemented with an inductive circuit element.

9. The negative-feedback type ultra-wideband signal amplification circuit of claim 1, wherein the output-side transistor circuit unit is implemented with an NMOS-based circuit architecture.

10. The negative-feedback type ultra-wideband signal amplification circuit of claim 1, wherein the output-side transistor circuit unit is implemented with a PMOS-based circuit architecture.

11. The negative-feedback type ultra-wideband signal amplification circuit of claim 1, wherein the output-side transistor circuit unit is implemented with a BJT (bipolar junction transistor) based circuit architecture.

12. The negative-feedback type ultra-wideband signal amplification circuit of claim 1, wherein the second-stage feedback circuit unit is implemented with an RC (resistance-capacitance) circuit.

13. The negative-feedback type ultra-wideband signal amplification circuit of claim 1, wherein the second-stage feedback circuit unit is implemented with an RL (resistance-inductance) circuit.

14. The negative-feedback type ultra-wideband signal amplification circuit of claim 1, wherein the second-stage load circuit unit is implemented with a resistive circuit element.

15. The negative-feedback type ultra-wideband signal amplification circuit of claim 1, wherein the output-side transistor circuit unit includes a capacitive circuit element connected to the output of the first-stage amplification module to provide a direct current blocking effect.

16. A negative-feedback type ultra-wideband signal amplification circuit with an input/output interface having a signal input port and a signal output port, for amplifying an input signal at the signal input port;

the negative-feedback type ultra-wideband signal amplification circuit comprising a first-stage amplification module and a second-stage amplification module; wherein:

the first-stage amplification module includes:

a dual-step filtering circuit unit, which includes a serially-connected LC circuit connected between the signal input port and the first node and an inductive element connected between the first node and a first bias voltage;

an input-side transistor circuit unit, which includes a first transistor and a second transistor, each having a control terminal, a first connecting terminal, and a second connecting terminal; wherein the first transistor has its control terminal connected to the first node, its first connecting terminal connected to a grounding point, and its second connecting terminal connected to the first connecting terminal of the second transistor; and wherein the second transistor has its control terminal connected to a fixed voltage source, its first connecting terminal connected to the second connecting terminal of the first transistor, and its second connecting terminal connected to the a second node;

a first-stage feedback circuit unit, which is connected between the second node and the first node, for providing a feedback path from the second node via the first node to the control terminal of the first transistor; and a first-stage load circuit unit, which is implemented with an inductive circuit element connected between the second node and a first bias voltage, for providing an enhanced amplification effect to a first-stage output signal at the second node, and wherein:

the second-stage amplification module includes:

an output-side transistor circuit unit, which includes a third transistor having a control terminal electrically coupled to the second node in the first-stage amplification module, a first connecting terminal connected to the signal output port, and a second connecting terminal connected to the grounding point;

a second-stage feedback circuit unit, which is connected between the signal output port and the control terminal of the third transistor, for providing a feedback path from the signal output port to the control terminal of the third transistor; and a second-stage load circuit unit, which is implemented with a resistive circuit element connected between the signal output port and a second bias voltage, for providing an enhanced amplification effect to a second-stage output signal at the signal output port.

17. The negative-feedback type ultra-wideband signal amplification circuit of claim 16, wherein the input-side transistor circuit unit is implemented with a PMOS-based circuit architecture.

18. The negative-feedback type ultra-wideband signal amplification circuit of claim 16, wherein the input-side transistor circuit unit is implemented with an NMOS-based circuit architecture.

19. The negative-feedback type ultra-wideband signal amplification circuit of claim 16, wherein the input-side transistor circuit unit is implemented with a BJT (bipolar junction transistor) based circuit architecture.

20. The negative-feedback type ultra-wideband signal amplification circuit of claim 16, wherein the first-stage feedback circuit unit is implemented with an RC (resistance-capacitance) circuit.

21. The negative-feedback type ultra-wideband signal amplification circuit of claim 16, wherein the first-stage feedback circuit unit is implemented with an RL (resistance-inductance) circuit.

22. The negative-feedback type ultra-wideband signal amplification circuit of claim 16, wherein the output-side transistor circuit unit is implemented with an NMOS-based circuit architecture.

23. The negative-feedback type ultra-wideband signal amplification circuit of claim 16, wherein the output-side transistor circuit unit is implemented with a PMOS-based circuit architecture.

24. The negative-feedback type ultra-wideband signal amplification circuit of claim 16, wherein the output-side transistor circuit unit is implemented with a BJT (bipolar junction transistor) based circuit architecture.

25. The negative-feedback type ultra-wideband signal amplification circuit of claim 16, wherein the second-stage feedback circuit unit is implemented with an RC (resistance-capacitance) circuit.

* * * * *